(12) United States Patent
Chen

(10) Patent No.: US 12,092,671 B2
(45) Date of Patent: Sep. 17, 2024

(54) CAPACITANCE MEASUREMENT APPARATUS

(71) Applicant: CHIPONE TECHNOLOGY (BEIJING) CO., LTD., Beijing (CN)

(72) Inventor: Chen Chen, Beijing (CN)

(73) Assignee: CHIPONE TECHNOLOGY (BEIJING) CO., LTD., Beijing (CN)

( * ) Notice: Subject to any disclaimer, the term of this patent is extended or adjusted under 35 U.S.C. 154(b) by 175 days.

(21) Appl. No.: 17/794,044

(22) PCT Filed: Dec. 17, 2020

(86) PCT No.: PCT/CN2020/137360
§ 371 (c)(1),
(2) Date: Jul. 20, 2022

(87) PCT Pub. No.: WO2021/179730
PCT Pub. Date: Sep. 16, 2021

(65) Prior Publication Data
US 2023/0065600 A1 Mar. 2, 2023

(30) Foreign Application Priority Data

Mar. 11, 2020 (CN) .......................... 202010167216.2

(51) Int. Cl.
*G01D 5/24* (2006.01)
*G01R 27/26* (2006.01)
(52) U.S. Cl.
CPC .......... *G01R 27/2605* (2013.01); *G01D 5/24* (2013.01)
(58) Field of Classification Search
CPC .............................. G01D 5/24; G01R 27/2605
See application file for complete search history.

(56) References Cited

U.S. PATENT DOCUMENTS

2019/0302928 A1\* 10/2019 Yuan ................... G06F 3/04166

FOREIGN PATENT DOCUMENTS

| CN | 102830882 A | 12/2012 |
| CN | 103902123 A | 7/2014 |

(Continued)

OTHER PUBLICATIONS

English Translation of recited Chinese patent documents.

(Continued)

*Primary Examiner* — Alesa Allgood
(74) *Attorney, Agent, or Firm* — Hogan Lovells US LLP

(57) ABSTRACT

Provided is a capacitance measurement apparatus (200), including: a channel capacitor (101) configured to generate different capacitance values according to a sensing signal; a measurement circuit (220) connected to the channel capacitor (101) and configured to access a pulse signal and measure a capacitance value of the channel capacitor (101); and an adjustment circuit (210) connected between the channel capacitor (101) and the measurement circuit (220), and configured to cancel a basic capacitance value of the channel capacitor (101) and generate a varying capacitance value of the channel capacitor (101). The measurement circuit (220) is further configured to convert the varying capacitance value of the channel capacitor (101) into an output signal. A reference capacitance of the channel capacitor (101) is canceled by means of the adjustment circuit (210), thereby increasing the valid range of an output signal of the measurement circuit (220).

19 Claims, 3 Drawing Sheets capacitance detection apparatus
200

(56) References Cited

FOREIGN PATENT DOCUMENTS

| | | |
|---|---|---|
| CN | 106598370 A | 4/2017 |
| CN | 107092407 A | 8/2017 |
| CN | 108475155 A | 8/2018 |
| CN | 208506138 U | 2/2019 |
| CN | 110196653 A | 9/2019 |
| CN | 110856448 A | 2/2020 |
| CN | 111399679 A | 7/2020 |
| EP | 2763008 A2 | 8/2014 |

OTHER PUBLICATIONS

First Office Action of CN 202010167216.2 with English Translation (Unknown Date).
Second Office Action of CN 202010167216.2 with English Translation (Unknown Date).
Third Office Action of CN 202010167216.2 with English Translation (Unknown Date).
First Search of CN 202010167216.2 (Unknown Date).
Supplementary Search of CN 202010167216.2 (Unknown Date).
International Search Report and Written Opinion issued in PCT Application No. PCT/CN2020/137360, dated Mar. 17, 2021 with English Translation.

* cited by examiner

CAPACITANCE MEASUREMENT APPARATUS

CROSS-REFERENCE TO RELATED APPLICATION

This application is a 371 application of PCT/CN2020/137360 filed on Dec. 17, 2020, which claims priority to the Chinese patent application filed with the Chinese Patent Office on Mar. 11, 2020 with the filing No. 2020101672162, and entitled "Capacitance Measurement Apparatus", all the contents of which are incorporated herein by reference in their entireties.

TECHNICAL FIELD

The present disclosure relates to the technical field of electronic products, and particularly to a capacitance detection apparatus (capacitance measurement apparatus).

BACKGROUND ART

The capacitive touch screen technology works by using current induction of human body. The capacitive touch screen is generally a four-layer composite glass screen, and four electrodes are led out from four corners. When a finger touches a metal layer, a coupling capacitor is formed between the human body and a surface of the touch screen due to the electric field of the human body, and for a high-frequency current, the capacitor is a direct conductor, so that the human finger takes away a very small current from a contact point. The current flows out of the electrodes on the four corners of the touch screen, respectively, the currents flowing through the four electrodes are in proportion to a distance from the finger to the four corners, and a controller obtains a position of a touch point through accurate calculation of proportions of the four currents.

In a practical application scenario of the capacitive touch screen, a state of the touch point is usually detected by a self-capacitance detection circuit. As the self-capacitance touch screen is provided with electrodes, each channel capacitor is formed, and the capacitance value change of the channel capacitor is detected by the self-capacitance detection circuit, further a touch condition of the touch point may be obtained according to the capacitance value change of the channel capacitor.

The conventional self-capacitance detection circuit consists of an operational amplifier and a feedback capacitor. By charging and discharging the channel capacitor, and transferring charges stored on the channel capacitor to an operational amplifier output end through the operational amplifier, a voltage value Vo is finally output, wherein this detected voltage value Vo represents the magnitude of a capacitance value of a detected channel capacitor Csen.

However, in the conventional detection method, the range of an effective signal of the output voltage Vo is too narrow, which is unfavorable for subsequent signal processing.

SUMMARY

One of the objectives of embodiments of the present disclosure lies in providing a capacitance detection apparatus, configured to counteract the influence of reference capacitance of a channel capacitor by an adjustment circuit, which increases an effective range of an output signal of a detection circuit.

In order to achieve the above objective, the present disclosure adopts the following technical solution.

A first aspect of embodiments of the present disclosure provides a capacitance detection apparatus, including: a channel capacitor, configured to generate different capacitance values according to a sensing signal; a detection circuit, connected to the channel capacitor, and configured to access a pulse signal, and detect the capacitance value of the channel capacitor; and an adjustment circuit, connected between the channel capacitor and the detection circuit, and configured to cancel out a basic capacitance value of the channel capacitor, and generate a varying capacitance value of the channel capacitor; and the detection circuit is further configured to convert the varying capacitance value of the channel capacitor into an output signal.

In a possible embodiment, the capacitance detection apparatus further includes: a first reset switch, wherein the first reset switch has a first end connected to a forward input end of the detection circuit, and a second end connected to a reverse input end of the detection circuit.

In a possible embodiment, the capacitance detection apparatus further includes: a detection switch, wherein the detection switch is connected between the second end of the first reset switch and the reverse input end of the detection circuit.

In a possible embodiment, the adjustment circuit includes: a reduced-basis element; and a first reduced-basis switch, wherein the first reduced-basis switch has one end connected to the reduced-basis element, and the other end connected to a positive pole of the channel capacitor, and when the first reduced-basis switch is closed, the channel capacitor is charged or discharged by the reduced-basis element.

In a possible embodiment, the first reduced-basis switch and the second reduced-basis switch operate in a same timing sequence.

In a possible embodiment, the reduced-basis element is a reduced-basis capacitor, a positive pole of the reduced-basis capacitor is connected to the first reduced-basis switch, and a negative pole of the reduced-basis capacitor is connected to a reference level port through a second reduced-basis switch.

In a possible embodiment, the adjustment circuit further includes: a first level switch, wherein the first level switch has one end connected to the positive pole of the reduced-basis capacitor, and the other end connected to a first level port.

In a possible embodiment, the first level switch includes: a first sub-switch, wherein the first sub-switch has one end connected to the positive pole of the reduced-basis capacitor, and the other end connected to a low level port of the first level port; and a second sub-switch, wherein the second sub-switch has one end connected to the positive pole of the reduced-basis capacitor, and the other end connected to a high level port of the first level port.

In a possible embodiment, the adjustment circuit further includes: a second level switch, wherein the second level switch has one end connected to the negative pole of the reduced-basis capacitor, and the other end connected to a second level port.

In a possible embodiment, the second level switch includes: a third sub-switch, wherein the third sub-switch has one end connected to the negative pole of the reduced-basis capacitor, and the other end connected to a low level port of the second level port; and a fourth sub-switch, wherein the fourth sub-switch has one end connected to the negative pole of the reduced-basis capacitor, and the other end connected to a high level port of the second level port.

In a possible embodiment, the first sub-switch and the fourth sub-switch operate in a same timing sequence, and the second sub-switch and the third sub-switch operate in a same timing sequence.

In a possible embodiment, the reduced-basis element is a current source; and the reduced-basis element includes: a first current source, wherein an input end of the first current source is connected to the first reduced-basis switch.

In a possible embodiment, the reduced-basis element further includes: a second current source; and a third reduced-basis switch, wherein the third reduced-basis switch has one end connected to the positive pole of the channel capacitor, and the other end connected to an output end of the second current source.

In a possible embodiment, the detection circuit includes: an operational amplifier, wherein a reverse input end of the operational amplifier is connected to the positive pole of the channel capacitor, and a forward input end of the operational amplifier is connected to a pulse signal port; and a feedback capacitor, connected between the reverse input end of the operational amplifier and an output end of the operational amplifier, and the detection circuit is configured to detect a varying capacitance value of the channel capacitor when the operational amplifier accesses a pulse signal through the pulse signal port.

In a possible embodiment, the detection circuit includes: a second reset switch, connected in parallel to the feedback capacitor.

For the capacitance detection apparatus provided in the present disclosure, by providing the adjustment circuit between the channel capacitor and the detection circuit, the reference capacitance of the channel capacitor is counteracted, further the effective change information of the capacitance valve of the channel capacitor is transmitted to the detection circuit, and the effective range of the output signal of the detection circuit is increased.

BRIEF DESCRIPTION OF DRAWINGS

In order to more clearly illustrate technical solutions of embodiments of the present disclosure, accompanying drawings which need to be used in the embodiments of the present disclosure will be introduced briefly below, and it should be understood that the accompanying drawings below merely show some embodiments of the present disclosure, therefore, they should not be considered as limitation on the scope, and those ordinarily skilled in the art still could obtain other relevant accompanying drawings according to these accompanying drawings, without using any creative efforts.

REFERENCE SIGNS

100—touch screen, 101—channel capacitor, 200—capacitance detection apparatus, 210—adjustment circuit, 220—detection circuit, 230—first reset switch, 240—detection switch, 211—reduced-basis capacitor, 212—first reduced-basis switch, 213—second reduced-basis switch, 214—first level switch, 215—first level port, 216—second level switch, 217—second level port, S1—first sub-switch, S2—second sub-switch, S3—third sub-switch, S4—fourth sub-switch, VL—low level port, VH—high level port, 221—operational amplifier, CF—feedback capacitor, 222—pulse signal port, 223—second reset switch, 218—first current source, 219—second current source, 219A—third reduced-basis switch.

Ph1, Ph2, Ph3, Ph3$b$, Ph3$n$, and Ph3$p$ represent reference signs of corresponding operation timing sequences, respectively.

DETAILED DESCRIPTION OF EMBODIMENTS

The technical solutions in the embodiments of the present disclosure will be described below in conjunction with accompanying drawings in the embodiments of the present disclosure. In the description of the present disclosure, terms such as "first" and "second" are merely for distinctive description, but should not be construed as indicating or implying importance in the relativity.

Figure 1:
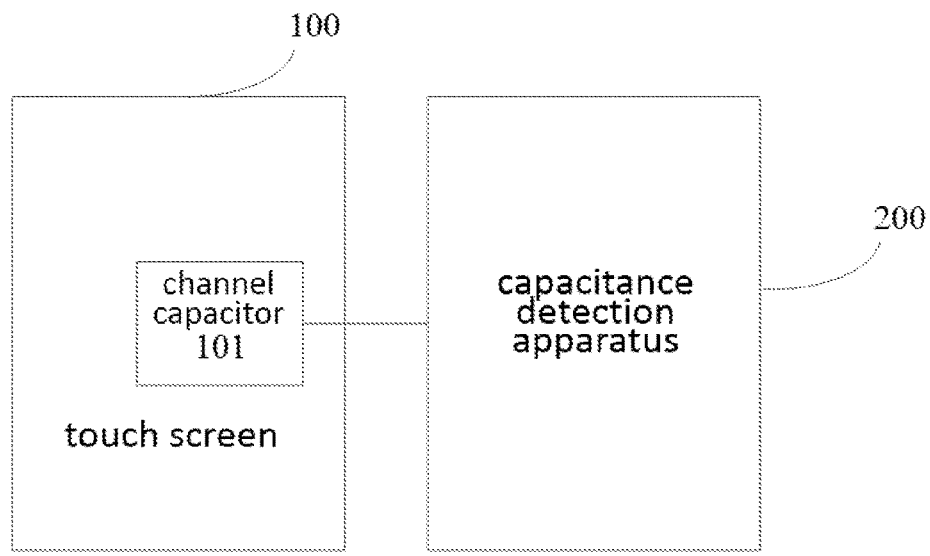
FIG. 1 is a schematic view of an application scenario of an embodiment of the present disclosure.

As shown in FIG. 1, the present embodiment provides an application scenario of a capacitance detection apparatus 200, including a touch screen 100 and a capacitance detection apparatus 200, wherein the touch screen 100 may be a self-capacitance touch screen. Electrodes are provided in the touch screen 100, thus forming a plurality of channel capacitors 101, and the touch screen 100 is configured to collect a sensing signal that causes a change in a value of the channel capacitors 101. The sensing signal may be a touch signal of a user's finger on the touch screen 100, and also may be a non-contact sensing signal. The capacitance detection apparatus 200 is configured to detect a change amount of a capacitance value of the channel capacitors 101.

In an embodiment, taking one of the channel capacitors 101 as an example, when the finger does not touch the touch screen 100, the capacitance value of the channel capacitor 101 is denoted as C1. When the finger touches the touch screen 100, the capacitance value of the channel capacitor 101 is denoted as C2, then the capacitance value change Cchange=C2−C1, that is, the change amount of the channel capacitor 101, and by detecting the capacitance value change of the channel capacitor 101, it may be detected whether a finger touches the touch screen.

Figure 2:
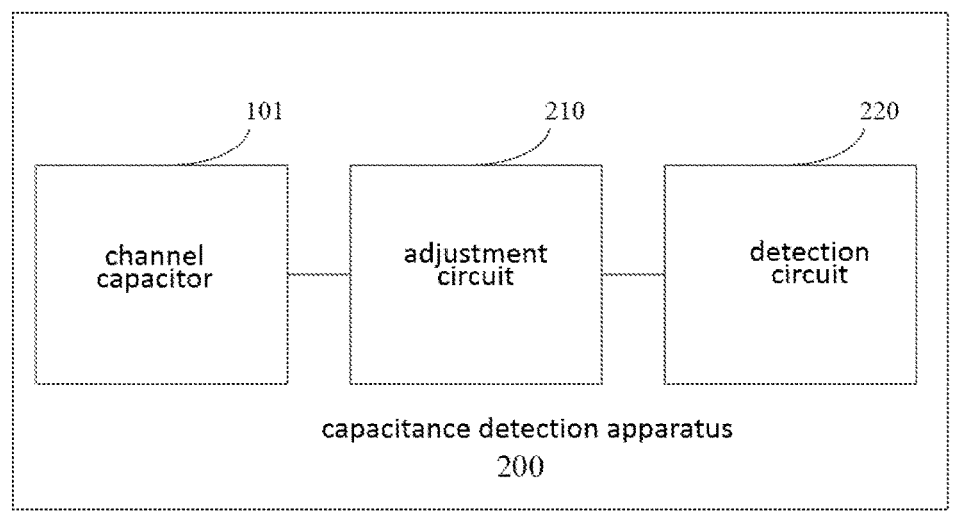
FIG. 2 is a circuit schematic view of a capacitance detection apparatus of an embodiment of the present disclosure.

As shown in FIG. 2, the present embodiment provides a capacitance detection apparatus 200, which can be applied to the application scenario shown in FIG. 1. The apparatus includes: a channel capacitor 101, an adjustment circuit 210, and a detection circuit 220, wherein the channel capacitor 101 is configured to generate different capacitance values according to a sensing signal. The detection circuit 220 is connected to the channel capacitor 101, and configured to access a pulse signal, and detect the capacitance value of the channel capacitor 101.

In an embodiment, the capacitance detection apparatus 200 charges and discharges the channel capacitor 101, and the detection circuit 220 transfers charges stored on the channel capacitor 101 to an output end, and finally a detection voltage value Vo is output, wherein this output voltage value Vo represents the magnitude of the capacitance value of the detected channel capacitor 101.

In an embodiment, the adjustment circuit 210 is connected between the channel capacitor 101 and the detection circuit 220, and is configured to cancel out invalid information in the capacitance value of the channel capacitor 101, and generate a varying capacitance value of the channel capacitor 101. The detection circuit 220 is further configured to convert the varying capacitance value of the channel capacitor 101 into an output signal. In practical application, a too large capacitance value C1 will cause a too narrow range of an effective signal of the output voltage Vo, and through the adjustment circuit 210, C1 may be subtracted during the detection. In this way, when the finger touches the touch screen 100, the range of the effective signal will be greatly increased over the entire range of the output voltage Vo of the detection circuit 220.

Figure 3:
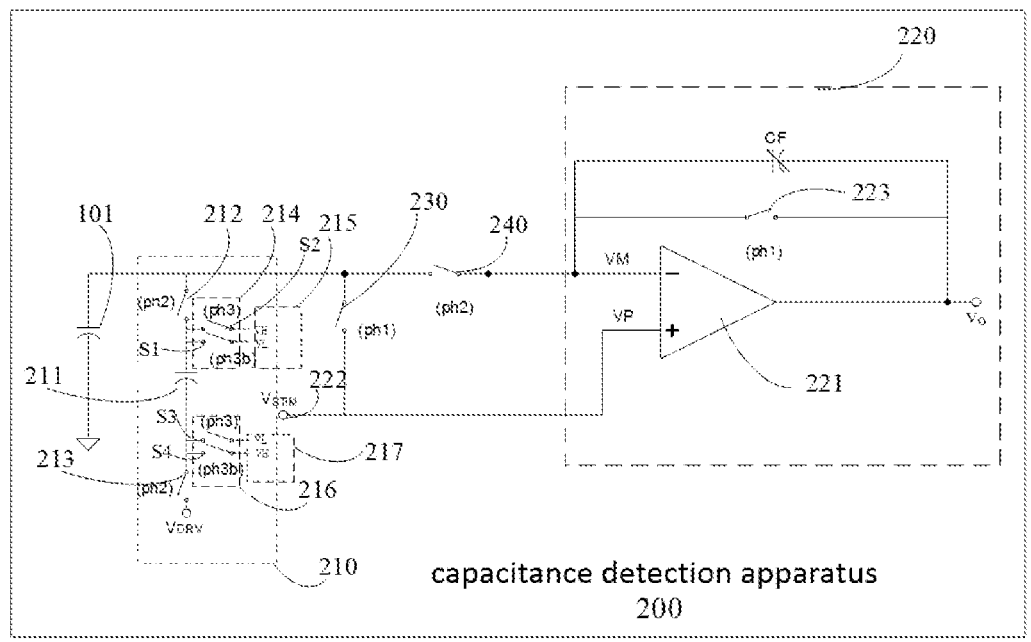
FIG. 3 is a circuit schematic view of the capacitance detection apparatus of an embodiment of the present disclosure.

As shown in FIG. 3, the present embodiment provides a capacitance detection apparatus 200, which can be applied to the application scenario shown in FIG. 1. The apparatus includes: a channel capacitor 101, an adjustment circuit 210, and a detection circuit 220.

In an embodiment, the detection circuit 220 includes: an operational amplifier 221, a feedback capacitor CF, and a second reset switch 223, wherein a reverse input end of the operational amplifier 221 is connected to a positive pole of the channel capacitor 101, and a forward input end of the operational amplifier 221 is connected to a pulse signal port 222. The feedback capacitor CF is connected between the reverse input end of the operational amplifier 221 and an output end of the operational amplifier 221. The second reset switch 223 is connected in parallel to the feedback capacitor CF.

In an embodiment, the capacitance detection apparatus 200 further includes: a first reset switch 230, which has a first end connected to the forward input end of the detection circuit 220, and a second end connected to a reverse input end of the detection circuit 220.

In an embodiment, the capacitance detection apparatus 200 further includes: a detection switch 240, which is connected between a second end of the first reset switch 230 and the reverse input end of the detection circuit 220.

In an embodiment, the adjustment circuit 210 includes: a reduced-basis element and a first reduced-basis switch 212, wherein the first reduced-basis switch 212 has one end connected to the reduced-basis element, and the other end connected to the positive pole of the channel capacitor 101. When the first reduced-basis switch is closed, the channel capacitor is charged or discharged by the reduced-basis element.

In an embodiment, the reduced-basis element is a reduced-basis capacitor 211, a positive pole of the reduced-basis capacitor 211 is connected to the first reduced-basis switch 212, and a negative pole of the reduced-basis capacitor 211 is connected to a reference level port through the second reduced-basis switch 213.

In an embodiment, the adjustment circuit 210 further includes: a first level switch 214, having one end connected to the positive pole of the reduced-basis capacitor 211, and the other end connected to the first level port 215.

In an embodiment, the first level switch 214 includes: a first sub-switch S1 and a second sub-switch S2, wherein the first sub-switch S1 has one end connected to the positive pole of the reduced-basis capacitor 211, and the other end connected to a low level port VL of the first level port 215. The second sub-switch S2 has one end connected to the positive pole of the reduced-basis capacitor 211, and the other end connected to a high level port VH of the first level port 215.

In an embodiment, the adjustment circuit 210 further includes: a second level switch 216, which has one end connected to the negative pole of the reduced-basis capacitor 211, and the other end connected to a second level port 217.

In an embodiment, the second level switch 216 includes: a third sub-switch S3 and a fourth sub-switch S4, wherein the third sub-switch S3 has one end connected to the negative pole of the reduced-basis capacitor 211, and the other end connected to a low level port VL of the second level port 217. The fourth sub-switch S4 has one end connected to the negative pole of the reduced-basis capacitor 211, and the other end connected to a high level port VH of the second level port 217.

Figure 4:
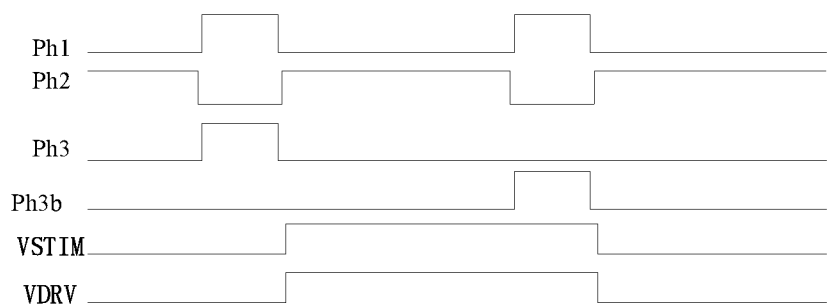
FIG. 4 is a schematic view of operation timing sequence of various components in the capacitance detection apparatus of an embodiment of the present disclosure.

In an embodiment, as shown in FIG. 4, a diagram of operation timing sequence of various elements of the capacitance detection apparatus 200 in the above FIG. 3, the first reset switch 230 and the second reset switch 223 operate in the same timing sequence, and a timing sequence number is Ph1. The detection switch 240, the first reduced-basis switch 212, and the second reduced-basis switch 213 operate in the same timing sequence, and a timing sequence number is Ph2. The second sub-switch S2 and the third sub-switch S3 operate in the same timing sequence, and a timing sequence number is Ph3. The first sub-switch S1 and the fourth sub-switch S4 operate in the same timing sequence, and a timing sequence number is Ph3$b$.

Based on the circuit diagram shown in FIG. 3 and the timing sequence diagram shown in FIG. 4, the operation principle of the capacitance detection apparatus 200 is as follows:

the pulse signal port 222 accesses a pulse signal VSTIM, and a complete pulse signal VSTIM period is a complete operation period of charge amplifier.

First Stage 1: Phase Stage in which the Pulse Signal VSTIM is Positive.

A switching element of the timing sequence Ph1 is closed (switched on), and accesses (connected to) a high potential. A switching element of the timing sequence Ph2 is switched off, and accesses a low potential. A switching element of the timing sequence Ph3 is closed, and accesses a high potential. A switching element of the timing sequence Ph3$b$ is switched off, and accesses a low potential. The capacitance detection apparatus 200 enters a RESET reset phase, and charges the channel capacitor 101 by a voltage difference between the high level port VH of the first level port 215 and the low level port VL of the second level port 217, and the charging is completed after time t1, then the reset charge amount
$Q\_RESET = Q\_Cbase = VH * Cbase$.

In the above, Q_Cbase represents the charge amount on the reduced-basis capacitor 211, VH represents the voltage value on the reduced-basis capacitor 211, and Cbase represents the capacitance value of the reduced-basis capacitor 211.

2: in an integration phase: the switching element of the timing sequence Ph1 is switched off, and accesses a low potential. The switching element of the timing sequence Ph2 is closed, and accesses a high potential. The switching element of the timing sequence Ph3 is switched off, and accesses a low potential. The switching element of the timing sequence Ph3$b$ is switched off, and accesses a low potential. The pulse signal VSTIM and the reference signal VDRV of the reference level port enter a state from a low potential to a high potential.

At this time, $Q\_INTERG=Q\_CSEN+Q\_Cbase+Q\_CF$.

$Q\_Csen=VH*Csen$.

$Q\_Cbase=0$.

$Q\_CF=(VH-VO)*CF$.

Finally, $Q\_RESET=Q\_INTERG$.

$VH*Cbase=VH*Csen+(VH-VO)*CF$.

$VO=VH(Csen+CF-Cbase)/CF$.

$=VH*[1-(Cbase-Csen)/CF]$.

In the above, Q_INTERG represents a total charge amount of the capacitance detection apparatus 200, Csen represents the capacitance value of the channel capacitor 101, Q_Csen represents the charge amount of the channel capacitor 101, CF represents the capacitance value of the feedback capacitor CF, and Q_CF represents the charge amount of the feedback capacitor CF. The VO represents the output voltage value of the output end of the operational amplifier 221.

Second Stage 1: Phase Stage in which the Pulse Signal VSTIM is Negative.

The switching element of the timing sequence Ph1 is closed, and accesses a high potential. The switching element of the timing sequence Ph2 is switched off, and accesses a low potential. The switching element of the timing sequence Ph3b is closed, and accesses a high potential. The switching element of the timing sequence Ph3 is switched off, and accesses a low potential. The capacitance detection apparatus 200 enters the RESET reset phase, and charges the channel capacitor 101 by a voltage difference between the low level port VL of the first level port 215 and the high level port VH of the second level port 217, and the charging is completed after time t2, then $Q\_RESET=Q\_Cbase=-VH*Cbase$.

2: in the integration phase: the switching element of the timing sequence Ph1 is switched off, and accesses a low potential. The switching element of the timing sequence Ph2 is closed, and accesses a high potential. The switching element of the timing sequence Ph3 is switched off, and accesses a low potential. The switching element of the timing sequence Ph3b is switched off, and accesses a low potential. The pulse signal VSTIM and the reference signal VDRV of the reference level port enter a state from a high potential to a low potential.

Then, $Q\_INTERG=Q\_Csen+Q\_Cbase+Q\_CF$.

$Q\_Csen=-VH*Csen$.

$Q\_Cbase=0$.

$Q\_CF=-VO*CF$.

Finally, $Q\_RESET=Q\_INTERG$.

$-VH*Cbase=-VH*Csen-VO*CF$.

$VO=VH*(Cbase-Csen)/CF$.

From the output voltage VO of the capacitance detection apparatus 200 in the positive and negative phase stages of the pulse signal VSTIM, an item (Cbase−Csen) is included, wherein Cbase is the capacitance value of the reduced-basis capacitor 211, functioning to cancel out the unchanged component Csen in the channel capacitor 101, and increase the effective range of the output signal of the detection circuit 220.

Figure 5:
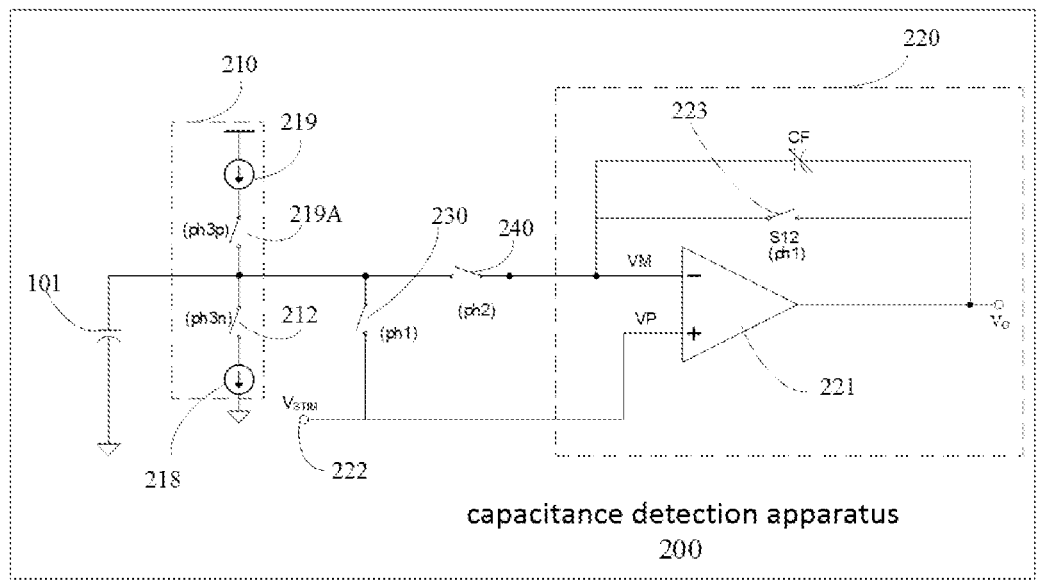
FIG. 5 is a circuit schematic view of the capacitance detection apparatus of an embodiment of the present disclosure.

As shown in FIG. 5, the present embodiment provides a capacitance detection apparatus 200, which can be applied to the application scenario shown in FIG. 1. The apparatus includes: a channel capacitor 101, an adjustment circuit 210, and a detection circuit 220.

In an embodiment, the reduced-basis element may be a current source. The reduced-basis element includes: a first current source 218, a second current source 219, and a third reduced-basis switch 219A, wherein an input end of the first current source 218 is connected to the first reduced-basis switch 212. The third reduced-basis switch 219A has one end connected to the positive pole of the channel capacitor 101, and the other end connected to the output end of the second current source 219. The connection relationship and principle of the detection circuit 220 and other elements may refer to related description of the above embodiment.

Figure 6:
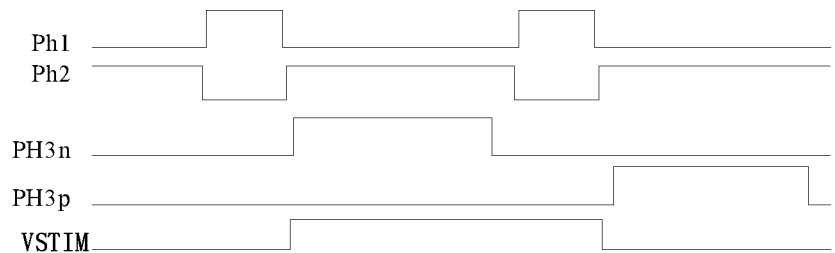
FIG. 6 is a schematic view of the operation timing sequence of various components in the capacitance detection apparatus of an embodiment of the present disclosure.

In an embodiment, as shown in FIG. 6, a diagram of operation timing sequence of various elements of the capacitance detection apparatus 200 in the above FIG. 5, the first reset switch 230 and the second reset switch 223 operate in the same timing sequence, and a timing sequence number is Ph1. A timing sequence number of the detection switch 240 is Ph2. A timing sequence number of the first reduced-basis switch 212 is Ph3n. A timing sequence number of the third reduced-basis switch 219A is Ph3p. Timing sequence numbers of the remaining switching elements refer to the description of the above embodiment corresponding to FIG. 3 and FIG. 4.

Based on the circuit diagram shown in FIG. 5 and the timing sequence diagram shown in FIG. 6, the operation principle of the capacitance detection apparatus 200 may be as follows:

the pulse signal port 222 accesses a pulse signal VSTIM, and a complete pulse signal VSTIM period is a complete operation period of charge amplifier.

First Stage 1: Phase Stage in which the Pulse Signal VSTIM is Positive.

A switching element of the timing sequence Ph1 is closed, and accesses a high potential. A switching element of the timing sequence Ph2 is switched off, and accesses a low potential. A switching element of the timing sequence Ph3n is switched off, and accesses a low potential. A switching element of the timing sequence Ph3p is switched off, and accesses a low potential. The capacitance detection apparatus 200 enters a RESET reset phase.

Then, reset charge amount $Q\_RESET=0$.

2: in an integration phase: the switching element of the timing sequence Ph1 is switched off, and accesses a low potential. The switching element of the timing sequence Ph2 is closed, and accesses a high potential. The switching element of the timing sequence Ph3n is closed, and accesses a high potential, that is, the first reduced-basis switch 212 is closed. The switching element of the timing sequence Ph3p is switched off, and accesses a low potential. The pulse signal VSTIM enters a state from a low potential to a high potential. The channel capacitor 101 is discharged by the first current source 218, and the discharging time is T1.

Then, $Q\_INTERG = Q\_Csen + Q\_CF + Q\_Is1$.

$Q\_Csen = VH*Csen$.

$Q\_CF = (VH-VO)*CF$.

Finally, $Q\_RESET = Q\_INTERG$.

$0 = VH*Csen + (VH-VO)*CF + Q\_Is1$.

Let $Is1*T1 = VH*Cbase$.

Then:

$VO = VH(Csen + CF - Cbase)/CF$.

$= VH*[1-(Cbase-Csen)/CF]$.

In the above, Q_Is1 denotes the charge amount of the first current source 218, and Is1 denotes an operation current value of the first current source 218.

Second Stage 1: Phase Stage in which the Pulse Signal VSTIM is Negative.

The switching element of the timing sequence Ph1 is closed, and accesses a high potential. The switching element of the timing sequence Ph2 is switched off, and accesses a low potential. The switching element of the timing sequence Ph3$n$ is switched off, and accesses a low potential. The switching element of the timing sequence Ph3$p$ is switched off, and accesses a low potential. The capacitance detection apparatus 200 enters the RESET reset phase.

At this time, Q_RESET=0.

2: in the integration phase stage: the switching element of the timing sequence Ph1 is switched off, and accesses a low potential. The switching element of the timing sequence Ph2 is closed, and accesses a high potential. The switching element of the timing sequence Ph3$n$ is switched off, and accesses a low potential. The switching element of the timing sequence Ph3$p$ is closed, and accesses a low potential, that is, the third reduced-basis switch 219A is closed. The pulse signal VSTIM enters a state from a high potential to a low potential. The channel capacitor 101 is charged by the second current source 219, and the charging time is T2.

Then, $Q\_INTERG = Q\_Csen + Q\_CF + Q\_Is2$.

$Q\_Csen = -VH*Csen$.

$Q\_CF = -VO*CF$.

Finally, $Q\_RESET = Q\_INTERG$.

$0 = -VH*Csen - VO*CF + Q\_Is2$.

Let $Is2*T2 = VH*Cbase$.

Then $VO = VH*(Cbase-Csen)/CF$.

From the output voltage VO of the capacitance detection apparatus 200 in the positive and negative phase stages of the pulse signal VSTIM, an item (Cbase−Csen) is included, wherein Cbase is the capacitance value of the reduced-basis capacitor 211, functioning to cancel out the unchanged component Csen in the channel capacitor 101, and increase the effective range of the signal of the output voltage VO.

Due to the operation principle of the reduced-basis capacitor 211 Cbase, the charges on the channel capacitor 101 are subtracted and cancelled out by the charges stored on the reduced-basis capacitor 211. Charging and discharging the channel capacitor 101 Csen by the current sources also may realize change in the charge amount on the Csen, thus completing the process of the reduced-basis capacitor 211.

When the voltage of the channel capacitor 101 is the high voltage V1, the above capacitance detection apparatus 200 turns on the first reduced-basis switch 212, and discharges the channel capacitor 101 through the first current source 218. The process of discharging may be expressed as:

$Q = Is*T1 = V1*Cbase$, where T1 is operation time of the reduced-basis process of the first current source 218.

When the voltage of the channel capacitor 101 is the low voltage V2, the third reduced-basis switch 219A is turned on, and the channel capacitor 101 is charged through the second current source 219. The process of charging may be expressed as:

$Q = Is*T2 = (V1-V2)*Cbase$, where T2 is operation time of the reduced-basis process of the second current source 219.

It may be seen therefrom that by adopting the current source as a reduced-basis element, and adjusting the magnitude of the current of the current source by the integration time T1 and T2 left by the system, the effect achieved after the reduced-basis may be adjusted. The chip area consumed by the self-capacitance detection circuit 220 may be significantly reduced, thereby reducing the chip cost, and saving the resources.

Although the embodiments of the present disclosure are described with reference to the accompanying drawings, a person skilled in the art could make various variations and modifications without departing from the spirit and principle of the present disclosure, and all of these variations and modifications fall within the scope defined by the attached claims.

INDUSTRIAL APPLICABILITY

By providing the adjustment circuit between the channel capacitor and the detection circuit, the capacitance detection apparatus provided in the present disclosure counteracts the reference capacitance of the channel capacitor, and further transmits the effective change information of the capacitance value of the channel capacitor to the detection circuit, thus increasing the effective range of the output signal of the detection circuit.

What is claimed is:

1. A capacitance detection apparatus, comprising:
    a channel capacitor, configured to generate different capacitance values according to a sensing signal;
    a detection circuit, connected to the channel capacitor, and configured to access a pulse signal, and detect a capacitance value of the channel capacitor; and
    an adjustment circuit, connected between the channel capacitor and the detection circuit, and configured to cancel out a basic capacitance value of the channel capacitor, and generate a varying capacitance value of the channel capacitor,
    wherein the detection circuit is further configured to convert the varying capacitance value of the channel capacitor into an output signal;

the apparatus further comprising:
a first reset switch, wherein the first reset switch has a first end connected to a forward input end of the detection circuit, and a second end connected to a reverse input end of the detection circuit.

2. The apparatus according to claim 1, wherein the adjustment circuit comprises:
a reduced-basis element; and
a first reduced-basis switch, wherein the first reduced-basis switch has one end connected to the reduced-basis element, and the other end connected to a positive pole of the channel capacitor, and when the first reduced-basis switch is closed, the channel capacitor is charged or discharged by the reduced-basis element.

3. The apparatus according to claim 1, wherein the detection circuit comprises:
an operational amplifier, wherein a reverse input end of the operational amplifier is connected to the positive pole of the channel capacitor, and a forward input end of the operational amplifier is connected to a pulse signal port; and
a feedback capacitor, connected between the reverse input end of the operational amplifier and an output end of the operational amplifier,
wherein the detection circuit is configured to detect the varying capacitance value of the channel capacitor when the operational amplifier accesses a pulse signal through the pulse signal port.

4. The apparatus according to claim 1, further comprising:
a detection switch, wherein the detection switch is connected between the second end of the first reset switch and the reverse input end of the detection circuit.

5. The apparatus according to claim 4, wherein the adjustment circuit comprises:
a reduced-basis element; and
a first reduced-basis switch, wherein the first reduced-basis switch has one end connected to the reduced-basis element, and the other end connected to a positive pole of the channel capacitor, and when the first reduced-basis switch is closed, the channel capacitor is charged or discharged by the reduced-basis element.

6. The apparatus according to claim 4, wherein the detection circuit comprises:
an operational amplifier, wherein a reverse input end of the operational amplifier is connected to the positive pole of the channel capacitor, and a forward input end of the operational amplifier is connected to a pulse signal port; and
a feedback capacitor, connected between the reverse input end of the operational amplifier and an output end of the operational amplifier,
wherein the detection circuit is configured to detect the varying capacitance value of the channel capacitor when the operational amplifier accesses a pulse signal through the pulse signal port.

7. The apparatus according to claim 1, wherein the detection circuit comprises:
an operational amplifier, wherein a reverse input end of the operational amplifier is connected to the positive pole of the channel capacitor, and a forward input end of the operational amplifier is connected to a pulse signal port; and
a feedback capacitor, connected between the reverse input end of the operational amplifier and an output end of the operational amplifier,
wherein the detection circuit is configured to detect the varying capacitance value of the channel capacitor when the operational amplifier accesses a pulse signal through the pulse signal port.

8. The apparatus according to claim 7, wherein the detection circuit comprises:
a second reset switch, wherein the second reset switch is connected in parallel to the feedback capacitor.

9. The apparatus according to claim 1, wherein the adjustment circuit comprises:
a reduced-basis element; and
a first reduced-basis switch, wherein the first reduced-basis switch has one end connected to the reduced-basis element, and the other end connected to a positive pole of the channel capacitor, and when the first reduced-basis switch is closed, the channel capacitor is charged or discharged by the reduced-basis element.

10. The apparatus according to claim 9, wherein the reduced-basis element is a current source; and the reduced-basis element comprises:
a first current source, wherein an input end of the first current source is connected to the first reduced-basis switch.

11. The apparatus according to claim 10, wherein the reduced-basis element further comprises:
a second current source; and
a third reduced-basis switch, wherein the third reduced-basis switch has one end connected to the positive pole of the channel capacitor, and the other end connected to an output end of the second current source.

12. The apparatus according to claim 9, wherein the reduced-basis element is a reduced-basis capacitor, a positive pole of the reduced-basis capacitor is connected to the first reduced-basis switch, and a negative pole of the reduced-basis capacitor is connected to a reference level port through a second reduced-basis switch.

13. The apparatus according to claim 12, wherein the first reduced-basis switch and the second reduced-basis switch operate in a same timing sequence.

14. The apparatus according to claim 13, wherein the adjustment circuit further comprises:
a first level switch, wherein the first level switch has one end connected to the positive pole of the reduced-basis capacitor, and the other end connected to a first level port.

15. The apparatus according to claim 12, wherein the adjustment circuit further comprises:
a first level switch, wherein the first level switch has one end connected to the positive pole of the reduced-basis capacitor, and the other end connected to a first level port.

16. The apparatus according to claim 15, wherein the first level switch comprises:
a first sub-switch, wherein the first sub-switch has one end connected to the positive pole of the reduced-basis capacitor, and the other end connected to a low level port of the first level port; and
a second sub-switch, wherein the second sub-switch has one end connected to the positive pole of the reduced-basis capacitor, and the other end connected to a high level port of the first level port.

17. The apparatus according to claim 16, wherein the adjustment circuit further comprises:
a second level switch, wherein the second level switch has one end connected to the negative pole of the reduced-basis capacitor, and the other end connected to a second level port.

18. The apparatus according to claim 17, wherein the second level switch comprises:

a third sub-switch, wherein the third sub-switch has one end connected to the negative pole of the reduced-basis capacitor, and the other end connected to a low level port of the second level port; and a fourth sub-switch, wherein the fourth sub-switch has one end connected to the negative pole of the reduced-basis capacitor, and the other end connected to a high level port of the second level port.

19. The apparatus according to claim 18, wherein the first sub-switch and the fourth sub-switch operate in a same timing sequence, and the second sub-switch and the third sub-switch operate in a same timing sequence.

* * * * *